US010768260B2

United States Patent
Moeller et al.

(10) Patent No.: US 10,768,260 B2
(45) Date of Patent: Sep. 8, 2020

(54) SYSTEM AND METHOD FOR CONTROLLING NOISE IN MAGNETIC RESONANCE IMAGING USING A LOCAL LOW RANK TECHNIQUE (71) Applicant: Regents of the University of Minnesota, Minneapolis, MN (US)

(72) Inventors: Steen Moeller, Golden Valley, MN (US); Mehmet Akcakaya, Minneapolis, MN (US)

(73) Assignee: Regents of the University of Minnesota, Minneapolis, MN (US)

( * ) Notice: Subject to any disclaimer, the term of this patent is extended or adjusted under 35 U.S.C. 154(b) by 24 days.

(21) Appl. No.: 16/133,550

(22) Filed: Sep. 17, 2018

(65) Prior Publication Data
US 2019/0086496 A1 Mar. 21, 2019

Related U.S. Application Data (60) Provisional application No. 62/559,928, filed on Sep. 18, 2017.

(51) Int. Cl.
*G01R 33/565* (2006.01)
*G06T 5/00* (2006.01)
(Continued)

(52) U.S. Cl.
CPC ............ *G01R 33/565* (2013.01); *G06T 5/002* (2013.01); *G06T 5/50* (2013.01); *G06T 7/0012* (2013.01);
(Continued)

(58) Field of Classification Search
CPC ... G01R 33/565; G01R 33/5611; G06T 5/002; G06T 5/50; G06T 7/0012; G06T 11/005;
(Continued)

(56) References Cited

U.S. PATENT DOCUMENTS 8,989,465 B2 3/2015 Trzasko et al.
2010/0329529 A1* 12/2010 Feldman .............. G06K 9/6252
382/131

(Continued)

FOREIGN PATENT DOCUMENTS

| CN | 103632347 A | 3/2014 |
| CN | 104156994 A | 11/2014 |
| CN | 104574298 A | 4/2015 |

OTHER PUBLICATIONS

Akcakaya, et al., Low-Dimensional-Structure Self-Learning and Thresholding: Regularization Beyond Compressed Sensing for MRI Reconstruction, Magnetic Resonance in Medicine, 2011, 66:756-767.

(Continued)

*Primary Examiner* — Akm Zakaria
(74) *Attorney, Agent, or Firm* — Quarles & Brady LLP (57) ABSTRACT A system and method for controlling noise in magnetic resonance imaging (MRI) are provided. In one aspect, the method includes reconstructing a series of images of the target using the image data, with each image being defined using signal-to-noise (SNR) units, and selecting an image patch corresponding to the series of images. The method also includes forming a matrix by combining vectors generated using the image patch, and applying a local low rank denoising technique using the matrix and the series of images to generate at least one denoised image.

19 Claims, 6 Drawing Sheets

(51) Int. Cl.
G06T 5/50 (2006.01)
G06T 7/00 (2017.01)
G06T 11/00 (2006.01)
G01R 33/561 (2006.01)

(52) U.S. Cl.
CPC ........ *G06T 11/005* (2013.01); *G01R 33/5611* (2013.01); *G06T 2207/10016* (2013.01); *G06T 2207/10088* (2013.01); *G06T 2207/20182* (2013.01); *G06T 2207/30024* (2013.01)

(58) Field of Classification Search
CPC . G06T 2207/10016; G06T 2207/30024; G06T 2207/20182; G06T 2207/10088
See application file for complete search history.

(56) References Cited

U.S. PATENT DOCUMENTS

| | | | | |
|---|---|---|---|---|
| 2013/0182930 | A1* | 7/2013 | Trzasko | G06T 11/003 382/131 |
| 2016/0025833 | A1* | 1/2016 | Polimeni | G01R 33/5611 324/309 |
| 2019/0053780 | A1* | 2/2019 | Song | G01S 7/52047 |

OTHER PUBLICATIONS

Allen, et al., Effect of a Low-Rank Denoising Algorithm on Quantitative Magnetic Resonance Imaging-Based Measures of Liver Fat and Iron, Journal of Computer Assisted Tomography, 2017, 41(3):412-416.
Cai, et al., A Singular Value Thresholding Algorithm for Matrix Completion, SIAM Journal on Optimization, 2010, 20(4):1956-1982.
Candes, et al., Unbiased Risk Estimates for Singular Value Thresholding and Spectral Estimators, IEEE Transactions on Signal Processing, 2013, 61(19):4643-4657.
Haldar, et al., Low-Rank Approximations for Dynamic Imaging, IEEE International Symposium on Biomedical Imaging: From Nano to Macro, 2011, pp. 1052-1055.
Haldar, et al., Improved Diffusion Imaging Through SNR-Enhancing Joint Reconstruction, Magnetic Resonance in Medicine, 2013, 69:277-289.
Haldar, et al., Whole-Brain Quantitative Diffusion MRI at 660 um Resolution in 25 Minutes Using gSlider-SMS and SNR-Enhancing Joint Reconstruction, In Proceedings of the 24th Annual Meeting of ISMRM, Singapore, 2016, p. 102.
Kellman, et al., Image Reconstruction in SNR Units: A General Method for SNR Measurement, Magnetic Resonance in Medicine, 2005, 54:1439-1447.
Li, et al., Adaptive Nonlocal Means Filtering Based on Local Noise Level for CT Denoising, Medical Physics, 2014, 41(1):011908, 16 pages.
Liu, et al., Patch-Based Denoising Method Using Low-Rank Technique and Targeted Database for Optical Coherence Tomography Image, Journal of Medical Imaging, 2017, 4(1):014002, 12 pages.
Lugauer, et al., Robust Spectral Denoising for Water-Fat Separation in Magnetic Resonance Imaging, International Conference on Medical Image Computing and Computer-Assisted Intervention, 2015, pp. 667-674.
Manjon, et al., Diffusion Weighted Image Denoising Using Overcomplete Local PCA, PLOS ONE, 2013, 8(9):e73021, 12 pages.
Marchenko, et al., Distribution of Eigenvalues for Some Sets of Random Matrices, Matematicheskii Sbornik, 1967, 114(4):507-536.
Nejati, et al., Denoising by Low-Rank and Sparse Representations, J. Vis. Commun. Image R., 2016, 36:28-39.
Nguyen, et al., Denoising MR Spectroscopic Imaging Data With Low-Rank Approximations, IEEE Trans. Biomed. Eng., 2013, 60(1):78-89.
Ong, et al., Beyond Low Rank+Sparse: Multi-Scale Low Rank Matrix Decomposition, IEEE J. Sel. Top Signal Process, 2016, 10(4):672-687.
Trzasko, et al., Local Versus Global Low-Rank Promotion in Dynamic MRI Series Reconstruction, Proc. Intl. Soc. Mag. Reson. Med., 2011, 19:4371.
Trzasko, et al., Sparsity and Low-Contrast Object Detectability, Magnetic Resonance in Medicine, 2012, 67:1022-1032.
Veraart, et al., Denoising of Diffusion MRI Using Random Matrix Theory, Neuroimage, 2016, 142:394-406.
Veraart, et al., Diffusion MRI Noise Mapping Using Random Matrix Theory, Magnetic Resonance in Medicine, 2016, 76(5):1582-1593.
Zhang, T., et al., Fast 3D DCE-MRI with Sparsity and Low-Rank Enhanced SPIRiT (SLR-SPIRiT), Proc. Intl. Soc. Mag. Reson. Med., 2013, 21:2624.
Zhang, T., et al., Accelerating Parameter Mapping with a Locally Low Rank Constraint, Magnetic Resonance in Medicine, 2015, 73:655-661.
Zhao, Accelerated MR Parameter Mapping with Low-Rank and Sparsity Constraints, Magnetic Resonance in Medicine, 2015, 74:489-498.

* cited by examiner

SYSTEM AND METHOD FOR CONTROLLING NOISE IN MAGNETIC RESONANCE IMAGING USING A LOCAL LOW RANK TECHNIQUE

CROSS-REFERENCE TO RELATED APPLICATIONS

This application claims the benefit of U.S. Provisional Patent Application Ser. No. 62/559,928, filed on Sep. 18, 2017, and entitled "SYSTEM AND METHOD FOR CONTROLLING NOISE IN MAGNETIC RESONANCE IMAGING USING A MULTI-SCALE LOCAL LOW RANK TECHNIQUE," which is herein incorporated by reference in its entirety.

STATEMENT REGARDING FEDERALLY SPONSORED RESEARCH

This invention was made with government support under EB015894 awarded by National Institutes of Health. The government has certain rights in the invention.

BACKGROUND

When a substance such as human tissue is subjected to a uniform magnetic field (polarizing field $B_0$), the individual magnetic moments of the nuclear spins in the tissue attempt to align with this polarizing field, but precess about it in random order at their characteristic Larmor frequency. Usually the nuclear spins are comprised of hydrogen atoms, but other NMR active nuclei are occasionally used. A net magnetic moment, $M_z$, is produced in the direction of the polarizing field, but the randomly oriented magnetic components in the perpendicular, or transverse, plane (x-y plane) cancel one another. If, however, the substance, or tissue, is subjected to a magnetic field (excitation field, $B_1$; also referred to as the radiofrequency ("RF") field) which is in the x-y plane and which is near the Larmor frequency, the net aligned moment, $M_z$, may be rotated, or "tipped" into the x-y plane to produce a net transverse magnetic moment, $M_t$, which is rotating, or spinning, in the x-y plane at the Larmor frequency. The practical value of this phenomenon resides in the signal which is emitted by the excited spins after the excitation field $B_1$ is terminated. There are a wide variety of measurement sequences in which this nuclear magnetic resonance ("NMR") phenomenon is exploited.

When utilizing these signals to produce images, magnetic field gradients ($G_x$, $G_y$, and $G_z$) are employed. Typically, the region to be imaged experiences a sequence of measurement cycles in which these gradients vary according to the particular localization method being used. The emitted MR signals are detected using a receiver coil. The MRI signals are then digitized and processed to reconstruct the image using one of many well-known reconstruction techniques.

Parallel imaging techniques use spatial information from arrays of RF receiver coils to substitute for the encoding that would otherwise have to be obtained in a sequential fashion using RF pulses and field gradients (such as phase and frequency encoding). Each of the spatially independent receiver coils of the array carries certain spatial information and has a different sensitivity profile. This information is utilized in order to achieve a complete location encoding of the received MR signals by a combination of the simultaneously acquired data received from the separate coils. Specifically, parallel imaging techniques undersample k-space by reducing the number of acquired phase-encoded k-space sampling lines while keeping the maximal extent covered in k-space fixed. The combination of the separate MR signals produced by the separate receiver coils enables a reduction of the acquisition time required for an image (in comparison to conventional k-space data acquisition) by a factor that in the most favorable case equals the number of the receiver coils. Thus the use of multiple receiver coils acts to multiply imaging speed, without increasing gradient switching rates or RF power.

The signal processing technique referred to as compressed sensing ("CS") facilitates reconstruction of signals from an incomplete Fourier representation, provided that certain conditions are met. This technique is capable of allowing the acceleration of MRI by collecting less data than conventionally required, thereby reducing the scan time. One condition that allows successful CS recovery is that the signal should be compactly represented under a mathematical transform. Another such condition is that the Fourier representation of the signal should be sampled so that the aliasing artifacts under this transform are incoherent. Still another condition is that a non-linear signal processing algorithm should be applied to enforce a compact representation while preserving the acquired data. Non-linear iterative CS reconstructions using sparsifying transforms are finding utility in various applications, but require a change in undersampling patterns to ensure that the incoherency condition is met. Unfortunately, most clinically-available uniform undersampling patterns yield aliasing artifacts that are not incoherent.

As techniques such as parallel imaging and compressed sensing are used to push the speed and complexity of MR imaging techniques, other limitations, such as noise, raise in prevalence.

SUMMARY OF THE DISCLOSURE

The present disclosure provides systems and methods directed to noise variance reduction ("NVR") that overcome the drawbacks of previous technologies. More particularly, a parameter-free, locally low rank soft-thresholding approach that uses spatial-temporal properties of noise for signal-to-noise ratio ("SNR") enhancement is provided. As will be described, the technique has wide clinical applicability, including applications to diffusion, functional MRI, arterial spin labeling ("ASL"), and anatomical imaging, where the soft-threshold parameter is automatically determined by the dimensionality of the measurements.

In accordance with the present disclosure, a method for generating a denoised image from data acquired with a magnetic resonance imaging (MRI) system is provided. An MRI system is controlled to acquire image data from a target, and a series of images of the target is reconstructed from the image data using a computer system. Pixel values in each image in the series of images are defined using signal-to-noise ratio (SNR) units. An image patch corresponding to the series of images is selected with the computer system, and a matrix is formed with the computer system by combining vectors generated using the image patch. A local low-rank denoising technique is applied with the computer system using the matrix and the series of images to generate at least one denoised image.

The foregoing and other aspects and advantages of the present disclosure will appear from the following description. In the description, reference is made to the accompanying drawings that form a part hereof, and in which there is shown by way of illustration preferred embodiments. These embodiments do not necessarily represent the full scope of the invention, however, and reference is therefore made to the claims and herein for interpreting the scope of the invention.

DETAILED DESCRIPTION

The present disclosure provides systems and methods for controlling noise in magnetic resonance imaging ("MRI") or otherwise generating magnetic resonance images with reduced noise. In particular, a noise variance reduction ("NVR") approach is described that utilizes spatial-temporal properties of noise to improve imaging data, without need for imposing assumptions on underlying image signals. The denoising approach can produce higher image signal-to-noise ratio ("SNR") without deteriorating resolution. This allows for improved imaging and more accurate quantitative analyses and parameters obtained therefrom.

As one example, the systems and methods described in the present disclosure can provide for parameter-free low-rank denoising, which enables accurate quantitative imaging (e.g., such as myocardial $T_1$ mapping) with visually high image quality. In addition, such denoised images can be generated at in-plane resolutions that in some applications may be up to 1.1×1.1 $mm^2$. In another example, the systems and methods described in the present disclosure can provide for parameter-free low-rank denoising, which enables accurate tractography mapping on the order of 0.7 $mm^3$ based on multi-shell diffusion-weighted imaging ("DWI") with b-values less than 3000 $s/mm^2$. In still another example, the systems and methods described in the present disclosure can provide for parameter-free low-rank denoising which enables accurate tractography mapping on the order of 2 $mm^3$ based on multi-shell DWI with b-values up to 10,000 $s/mm^2$.

Commonly used denoising techniques in MRI rely on linear processing, such as Gaussian or Hanning filters, which trade off noise reduction with a deteriorated point-spread-function. An alternative strategy, based on compressed sensing ("CS"), uses non-linear processing, exploiting the underlying low-dimensional properties of the images (such as sparsity-based, data-driven or rank-based), to remove aliasing artifacts and reduce noise in the final reconstructed images. However, CS approaches require incoherent sampling of the k-space, which can be achieved by random undersampling in Cartesian acquisitions or via non-Cartesian trajectories. This approach may not be advantageous in 2D single-shot EPI acquisitions, for instance, which are favored in functional MRI ("fMRI") and diffusion-weighted ("dMRI") methods. CS also relies on computationally expensive iterative processing, which alternatively enforces data consistency with acquired k-space and regularization based on low-dimensionality. Furthermore, the choice of regularization parameters in CS-based approaches is often done empirically, making it difficult to streamline across different anatomies. In addition, the combination of simultaneous multi-slice ("SMS") and multi-band ("MB") imaging, which is commonly used in dMRI and fMRI, with CS has been shown to be have some drawbacks relative to a combination of SMS/MB and parallel imaging ("PI") in two-dimensional imaging.

By contrast, the NVR approach described in the present disclosure utilizes the advantages of non-linear processing, but can be utilized with SMS/MB EPI acquisitions preferred in fMRI and dMRI, for example. Specifically, by first performing a parallel imaging reconstruction of the acquired image data, for instance, results from random matrix theory may be employed to derive pre-determined thresholding parameters, independent of the data acquisition.

In this manner, the systems and methods described in the present disclosure can provide improved performance of an MRI system by enabling data acquisition techniques for acquiring data that would otherwise result in noisy images or require the use of computationally intensive reconstruction techniques. The systems and methods described in the present disclosure can also improve the functioning of a computer system that is configured to reconstruct images from data acquired with an MRI system, or to process such images to reduce noise. For instance, the systems and methods described in the present disclosure can generate in higher quality images with fewer computational resources than other methods, thereby improving the functioning of a computer system configured to generate such images.

In particular, the systems and methods described in the present disclosure utilize a local low rank approach in a post-processing performed after image reconstruction. The algorithm uses overlapping blocks and a distance weighted approach for combining these blocks to achieve denoising. In some implementations, the overlapping blocks may be sparsely overlapping blocks. This approach reduces the computational complexity and allows for better noise removal. In some aspects, the NVR algorithm described in the present disclosure may utilize a multiscale approach by utilizing a weighted combination of patches having different dimensions and shapes to produce improved noise removal. This implementation takes advantage of additional redundancies in the input images to achieve improved local denoising. The present noise-removal is parameter free, and takes into consideration image data noise level. However, repeated application of the multiscale filtering may introduce a parameter along with a stopping criteria.

In some aspects, the systems and methods described in the present disclosure may process complex-valued signals that have been obtained in low SNR applications with an MRI system, such as susceptibility weighted imaging ("SWI"). Alternatively, or additionally, the systems and methods described in the present disclosure can be applied to magnitude signals. For instance, magnitude signals may be obtained from higher SNR image data, since the noise distribution is sufficiently close to a Gaussian distribution. To this end, the systems and methods described in the present disclosure may find a broad range of applications, including for reducing noise in images acquired with fMRI, diffusion, arterial spin labeling ("ASL"), and other techniques, without needing to modify the underlying acquisition sequences.

It is recognized herein that low-dimensional information present in image data, acquired using common clinical pulse sequences (even those that yield aliasing artifacts that are coherent), can be leveraged to facilitate a CS-based reconstruction, particularly when performing a parallel imaging reconstruction. To this end, acquired fMRI or dMRI k-space data, for instance, may be reconstructed with standard parallel imaging methods, such as SENSE or GRAPPA, in SNR units. This ensures that the underlying noise distribution corresponds to a standard normal distribution.

Figure 1:
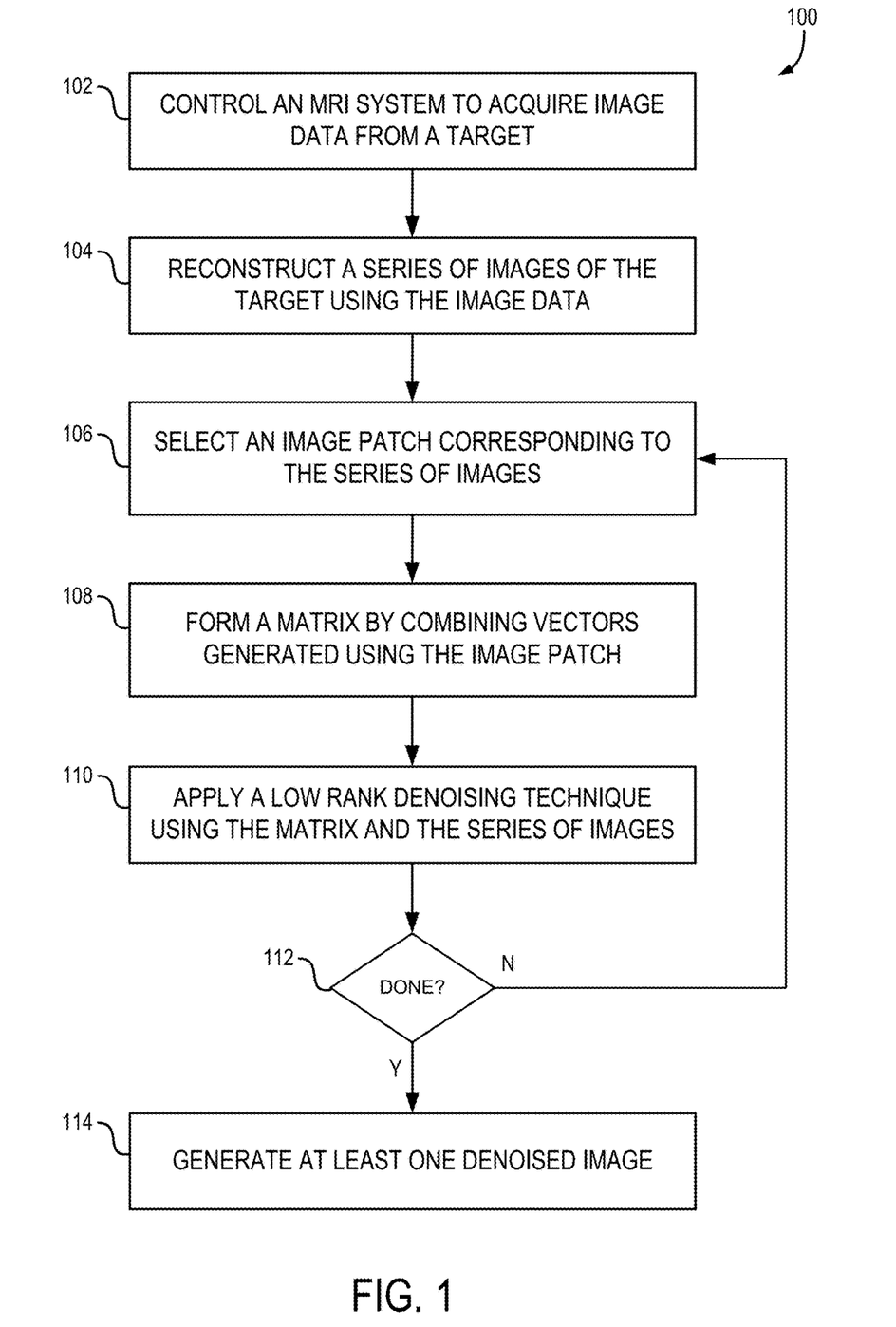
FIG. 1 is a flowchart setting forth steps of a process, in accordance with aspects of the present disclosure.

Referring now to FIG. 1, a flowchart setting forth steps of a process 100 in accordance with aspects of the present disclosure is shown. The process 100 may be carried out using any suitable system, computer, or device, including systems described in the present disclosure. In some implementations, the process 100 may be embodied in a program, software, or instructions executable by a processor. The program, software, or instructions can be stored in a non-transitory computer readable medium, or other data storage location.

The process 100 may begin at process block 102 with controlling an MRI system to acquire image data from a target. As an example, fMRI image data, diffusion image data, ASL image data, and other image data may be acquired at process block 102. Using the acquired image data, a series of images may be reconstructed at process block 104. In some aspects, a parallel imaging reconstruction technique such as a Generalized Autocalibrating Partially Parallel Acquisition ("GRAPPA") and a sensitivity-encoding ("SENSE") reconstruction technique may be utilized. The reconstruction may also include generating images defined by SNR units using a noise-decorrelation technique. As described, complex as well as magnitude signal data extracted from the MRI system may be utilized. In some other implementations, images that have been previously reconstructed can be accessed from a memory or other suitable data storage and provided as an input to a computer system. As noted, the images that are reconstructed or otherwise accessed can be reconstructed in SNR units, which can help ensure that the underlying noise distribution in the reconstruction corresponds to a standard normal distribution.

In some implementations, the images can be normalized by g-factor maps to achieve a uniform noise distribution. The g-factor maps can be generated as part of a parallel image reconstruction. In general, such g-factor maps depict a spatial distribution of the g-factor in the imaged volume.

At process block 106, an image patch corresponding to the series of images may be selected. For example, an $m_b \times n_b$ image patch may be selected across an image series (where the series is across time in fMRI; and across q-space in dMRI, for example). As an example, for a fixed pixel location, patches of size $m_b \times n_b$ centered at that pixel throughout the series of N images can be extracted. In some instances, the noise can be assumed to be independent across such an image series. These patches, which are positioned at the given pixel, are then vectorized in order to generate vectors to be utilized to form a matrix, as indicated by process block 108. As mentioned, the matrix may be a Casorati matrix, whose number of columns may equal the length of the image series. For instance, the vectors can be put together to form a Casorati matrix whose dimension is $m_b n_b \times N$. This Casorati matrix can equal the sum of the underlying image signal plus a standard normal Gaussian matrix, since the original data is in SNR units. Due to redundancies in the image series that acquire the same anatomy over time or through contrast changes (e.g., across different contrast weightings), this Casorati matrix can be represented accurately by a low-rank matrix, which can be enforced via singular value thresholding or other suitable techniques. This process can be repeated for other pixels to cover the whole image in-plane as a local low rank denoising.

Figure 3A:
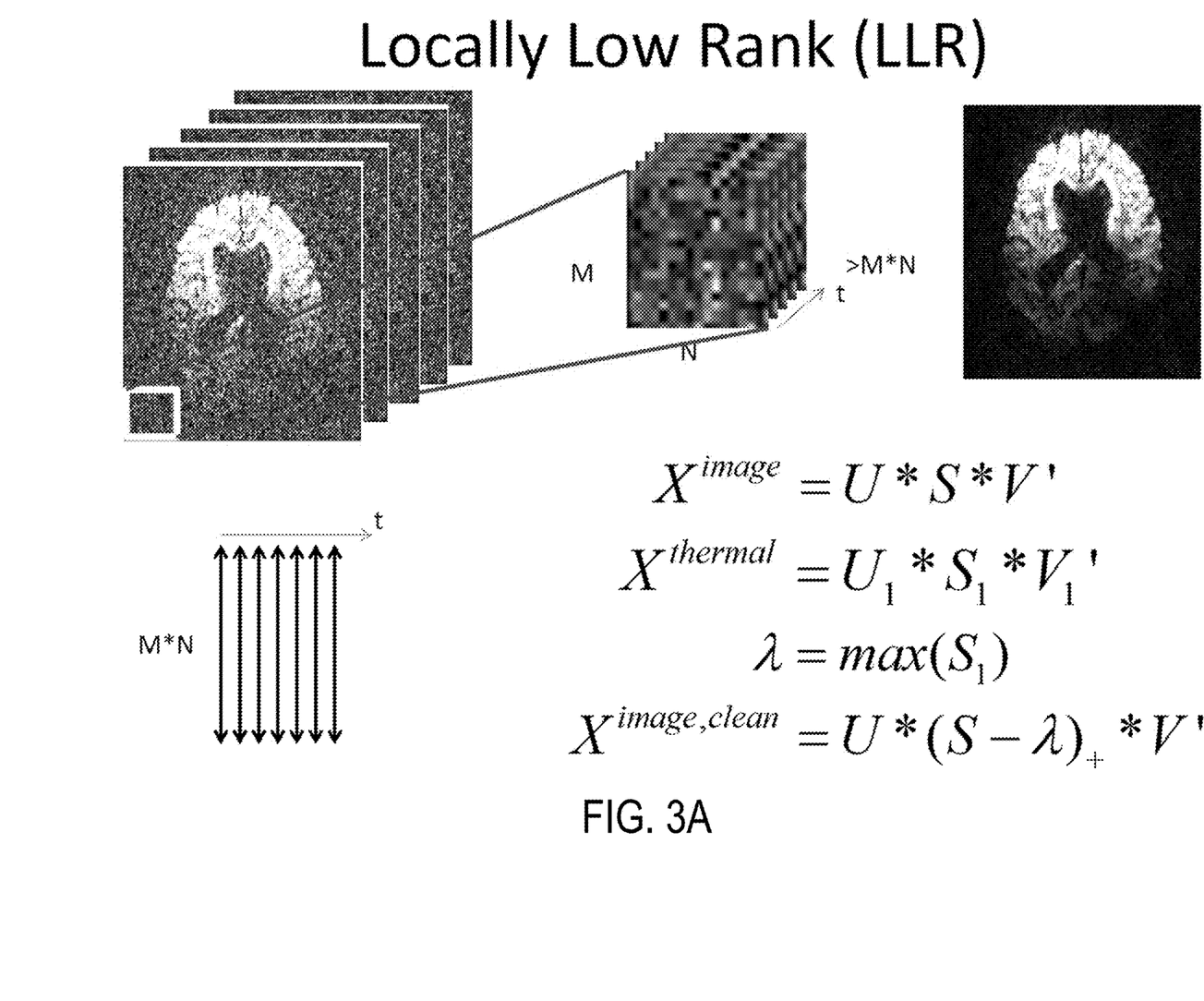
FIG. 3A is an illustration showing a denoising approach, in accordance with aspects of the present disclosure.

A local low rank denoising technique may then be applied at process block 110 using the matrix and the series of images. As one example, a singular value decomposition technique may be utilized (FIG. 3A). After evaluating a stopping criteria at block 112, at least one denoised image may be generated, as indicated by process blocks 114. The stopping criteria at block 112 may be based, for example, on evaluating whether a target SNR has been reached. In some aspects, the low rank properties of the local patch may be enforced by singular value thresholding ("SVT"). In these instances, the threshold parameter in the SVT may be analytically determined from the singular values of a random Gaussian matrix, which follow a Marchenko-Pastur distribution. In some embodiments, the threshold parameter can be determined based on a weighted average of singular values. In some other embodiments, the threshold parameter can be selected as the largest singular value.

Advantageously, by normalizing the image patches as described in the present disclosure, a single threshold parameter can be used for all image patches. In some implementations, the threshold parameter can be multiplied by a g-factor map, thereby generating a spatially varying threshold.

Figure 3B:
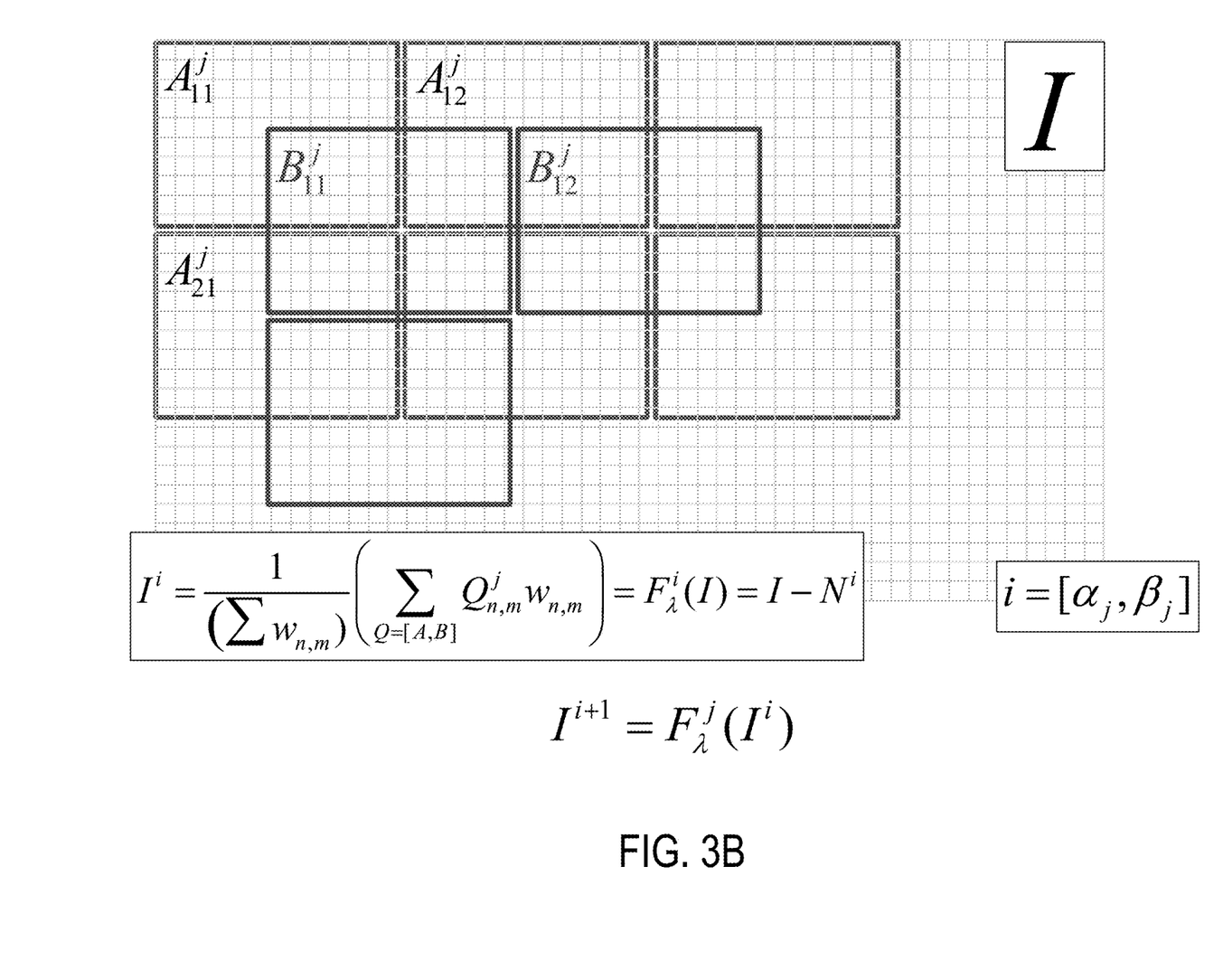
FIG. 3B is an illustration of a locally low rank algorithm, in accordance with aspects of the present disclosure.

As shown in FIG. 1, the process 100 may then be repeated a number of times, using overlapping patches to avoid blocking artifacts, with patches being shifted by half a patch size in each direction, for instance. As described, patches of different scales, sizes and shapes may also be utilized, providing benefits to CS-based approaches and image denoising. The Casorati matrix may then be formed using a distance weighted approach combining the sparsely overlapping blocks (FIG. 3B).

As noted, in some implementations a multiscale denoising can be utilized. In such instances, multiple patch sizes, $m_1^{(k)} \times m_2^{(k)}$, with their corresponding regularization parameters, $\lambda^{(k)}$, which may be determined from the Marchenko-Pastur distribution as described above, can be used. Letting $R_{m,n}^p$ be an operator that extracts an m×n block whose center is at a pixel location, p into a Casorati matrix, and letting Y be a noisy image series, the following denoising problem can be solved, $$\min_X \sum_p \sum_k \left[ \frac{1}{2} \left\| R_{m_1^{(k)}, m_2^{(k)}}^p (Y - X) \right\|_F^2 + \lambda_{MP}^{(k)} \left\| R_{m_1^{(k)}, m_2^{(k)}}^p (X) \right\|_* \right] \quad (1)$$

In any event, the denoised image(s) generated at process block 114 may then be displayed, analyzed or further processed, for example, to extract various quantitative parameters. In some instances, the images can be re-normalized by the g-factor maps.

Figure 2:
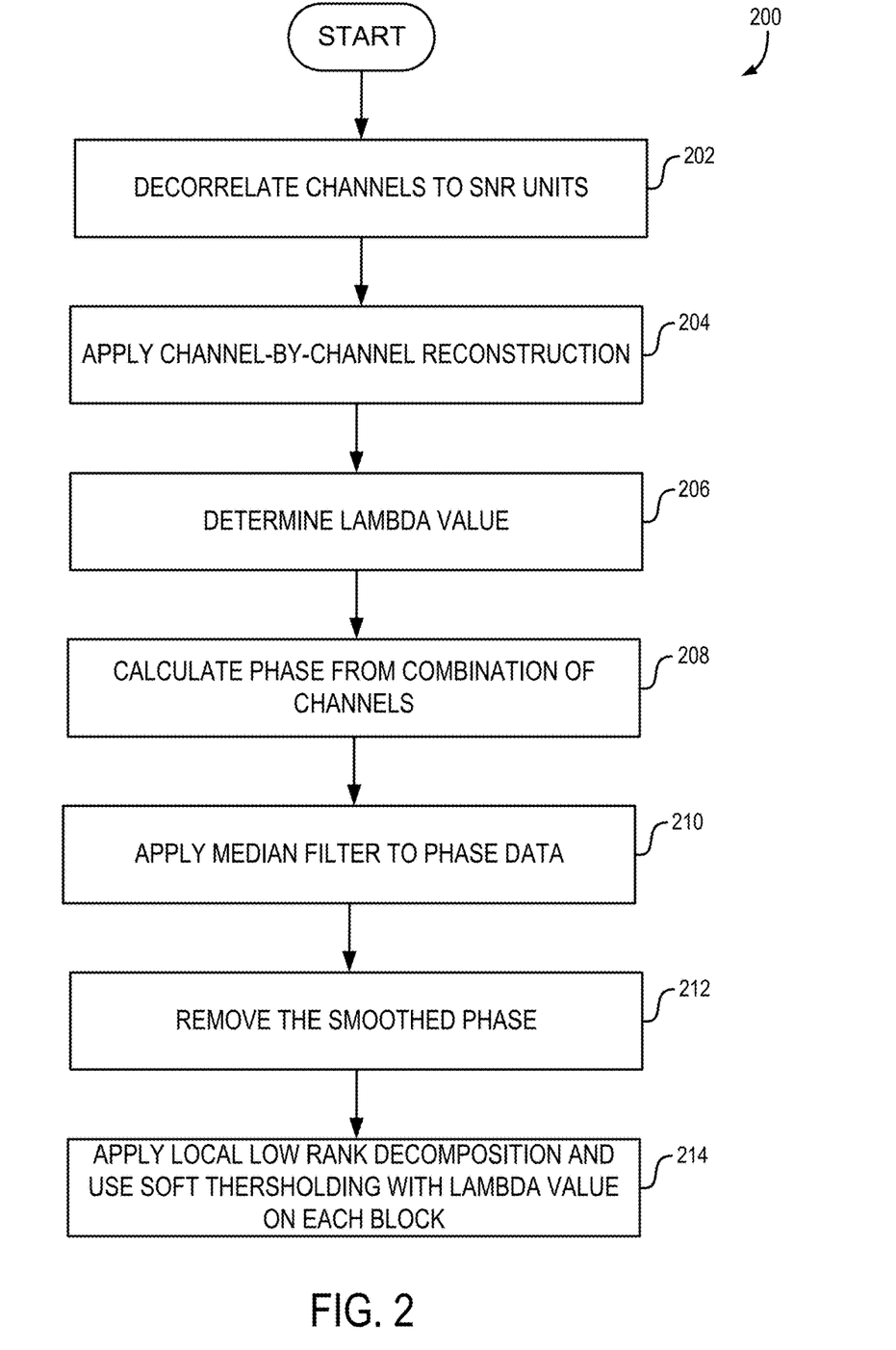
FIG. 2 is another flowchart setting forth steps of a process, in accordance with aspects of the present disclosure.

Referring now to FIG. 2, a flowchart setting forth steps of another process 200 in accordance with aspects of the present disclosure is shown. Similarly, the process 200 may be carried out using any suitable system, computer or device, including systems described in the present disclosure. In some implementations, the process 200 may be embodied in a program, software or instructions executable by a processor, the program, software or instructions being stored as in a non-transitory computer readable medium, or other data storage location.

The process 200 may begin at process block 202 decorrelating to SNR units image data acquired using different channels, which are associated with different localized receiver coils of an MRI system. This may be accomplished by using noise-decorrelation technique. In some aspects, image data may be acquired at process block 202 from a target. Then, at process block 204, a channel-by-channel reconstruction may be carried, for instance using a GRAPPA, SLICE-GRAPPA, or other reconstruction technique.

At process block 206, a parameter value, lambda (FIG. 3A), may be determined based on the length of the signal and first singular value from a singular value decomposition of a noise-matrix with dimension of the local low rank matrix, generated as described. A phase may then be calculated at process block 208 from a combination, i.e. a SENSE 1 combination, of the channels. A median filter with a selected kernel, for example a 5×5 kernel, may then be applied to the phase data, as indicated by process block 210. The smoothed phase may then be removed, as indicated by process block 212, from either the combination or each channel. A locally low rank ("LLR") decomposition may then be applied at process block 212, whereby a soft thresholding with lambda value is applied on each block. In this manner, at least one denoised image may be generated. As described, denoised images may then displayed, or further analyzed or processed.

Figure 4:
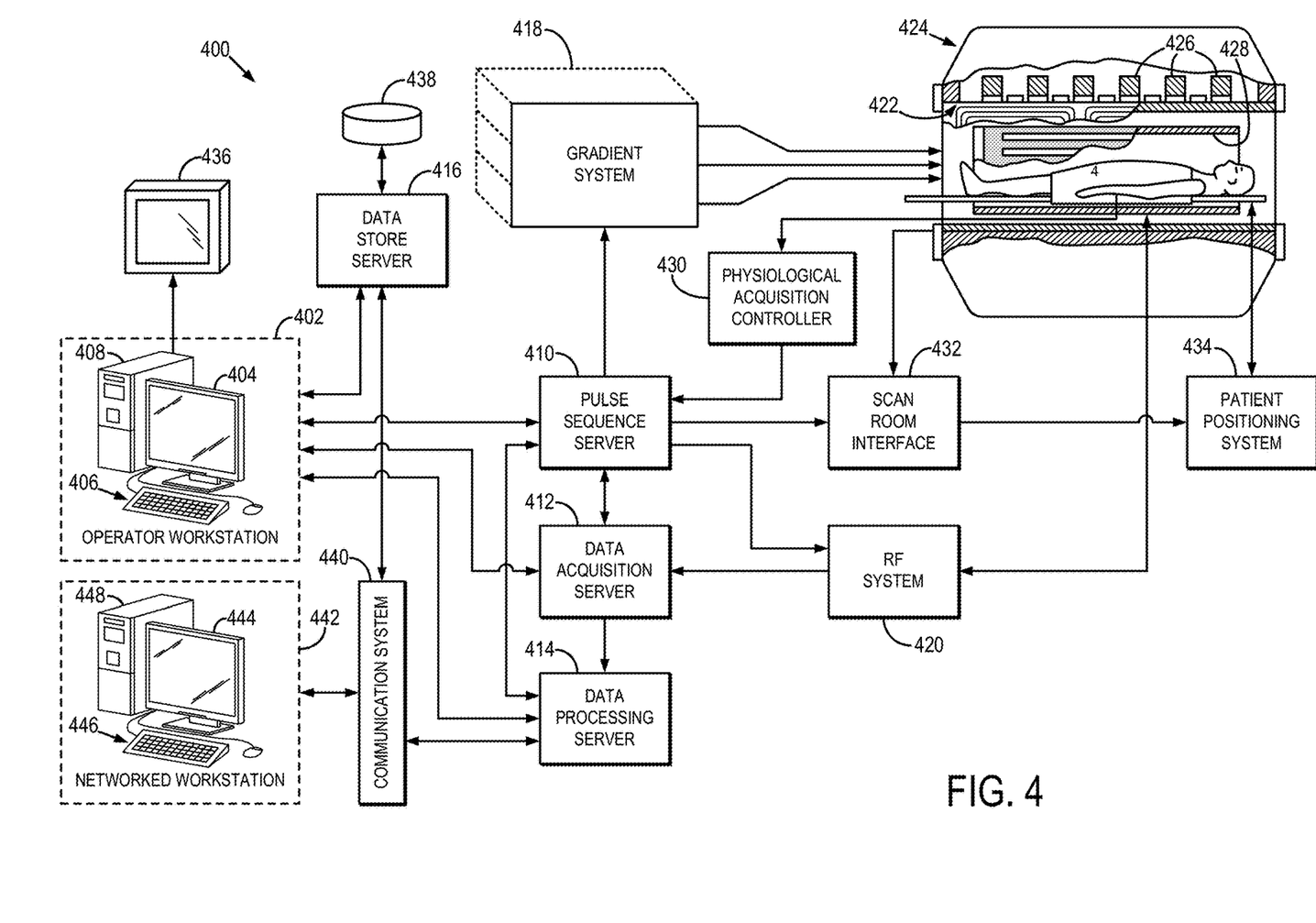
FIG. 4 is a block diagram of an example magnetic resonance imaging ("MRI") system that can implement the methods described in the present disclosure.

Referring particularly now to FIG. 4, an example of an MRI system 400 that can implement the methods described here is illustrated. The MRI system 400 includes an operator workstation 402 that may include a display 404, one or more input devices 406 (e.g., a keyboard, a mouse), and a processor 408. The processor 408 may include a commercially available programmable machine running a commercially available operating system. The operator workstation 402 provides an operator interface that facilitates entering scan parameters into the MRI system 400. The operator workstation 402 may be coupled to different servers, including, for example, a pulse sequence server 410, a data acquisition server 412, a data processing server 414, and a data store server 416. The operator workstation 402 and the servers 410, 412, 414, and 416 may be connected via a communication system 440, which may include wired or wireless network connections.

The pulse sequence server 410 functions in response to instructions provided by the operator workstation 402 to operate a gradient system 418 and a radiofrequency ("RF") system 420. Gradient waveforms for performing a prescribed scan are produced and applied to the gradient system 418, which then excites gradient coils in an assembly 422 to produce the magnetic field gradients $G_x$, $G_y$, and $G_z$ that are used for spatially encoding magnetic resonance signals. The gradient coil assembly 422 forms part of a magnet assembly 424 that includes a polarizing magnet 426 and a whole-body RF coil 428.

RF waveforms are applied by the RF system 420 to the RF coil 428, or a separate local coil to perform the prescribed magnetic resonance pulse sequence. Responsive magnetic resonance signals detected by the RF coil 428, or a separate local coil, are received by the RF system 420. The responsive magnetic resonance signals may be amplified, demodulated, filtered, and digitized under direction of commands produced by the pulse sequence server 410. The RF system 420 includes an RF transmitter for producing a wide variety of RF pulses used in MRI pulse sequences. The RF transmitter is responsive to the prescribed scan and direction from the pulse sequence server 410 to produce RF pulses of the desired frequency, phase, and pulse amplitude waveform. The generated RF pulses may be applied to the whole-body RF coil 428 or to one or more local coils or coil arrays.

The RF system 420 also includes one or more RF receiver channels. An RF receiver channel includes an RF preamplifier that amplifies the magnetic resonance signal received by the coil 428 to which it is connected, and a detector that detects and digitizes the I and Q quadrature components of the received magnetic resonance signal. The magnitude of the received magnetic resonance signal may, therefore, be determined at a sampled point by the square root of the sum of the squares of the I and Q components:

$$M=\sqrt{I^2+Q^2} \qquad (2);$$

and the phase of the received magnetic resonance signal may also be determined according to the following relationship:

$$\varphi = \tan^{-1}\left(\frac{Q}{I}\right). \qquad (3)$$

The pulse sequence server 410 may receive patient data from a physiological acquisition controller 430. By way of example, the physiological acquisition controller 430 may receive signals from a number of different sensors connected to the patient, including electrocardiograph ("ECG") signals from electrodes, or respiratory signals from a respiratory bellows or other respiratory monitoring devices. These signals may be used by the pulse sequence server 410 to synchronize, or "gate," the performance of the scan with the subject's heart beat or respiration.

The pulse sequence server 410 may also connect to a scan room interface circuit 432 that receives signals from various sensors associated with the condition of the patient and the magnet system. Through the scan room interface circuit 432, a patient positioning system 434 can receive commands to move the patient to desired positions during the scan.

The digitized magnetic resonance signal samples produced by the RF system 420 are received by the data acquisition server 412. The data acquisition server 412 operates in response to instructions downloaded from the operator workstation 402 to receive the real-time magnetic resonance data and provide buffer storage, so that data is not lost by data overrun. In some scans, the data acquisition server 412 passes the acquired magnetic resonance data to the data processor server 414. In scans that require information derived from acquired magnetic resonance data to control the further performance of the scan, the data acquisition server 412 may be programmed to produce such information and convey it to the pulse sequence server 410. For example, during pre-scans, magnetic resonance data may be acquired and used to calibrate the pulse sequence performed by the pulse sequence server 410. As another example, navigator signals may be acquired and used to adjust the operating parameters of the RF system 420 or the gradient system 418, or to control the view order in which k-space is sampled. In still another example, the data acquisition server 412 may also process magnetic resonance signals used to detect the arrival of a contrast agent in a magnetic resonance angiography ("MRA") scan. For example, the data acquisition server 412 may acquire magnetic resonance data and processes it in real-time to produce information that is used to control the scan.

The data processing server 414 receives magnetic resonance data from the data acquisition server 412 and processes the magnetic resonance data in accordance with instructions provided by the operator workstation 402. Such processing may include, for example, reconstructing two-dimensional or three-dimensional images by performing a Fourier transformation of raw k-space data, performing other image reconstruction algorithms (e.g., iterative or backprojection reconstruction algorithms), applying filters to raw k-space data or to reconstructed images, generating functional magnetic resonance images, or calculating motion or flow images.

Images reconstructed by the data processing server 414 are conveyed back to the operator workstation 402 for storage. Real-time images may be stored in a data base memory cache, from which they may be output to operator display 402 or a display 436. Batch mode images or selected real time images may be stored in a host database on disc storage 438. When such images have been reconstructed and transferred to storage, the data processing server 414 may notify the data store server 416 on the operator workstation 402. The operator workstation 402 may be used by an operator to archive the images, produce films, or send the images via a network to other facilities.

The MRI system 400 may also include one or more networked workstations 442. For example, a networked workstation 442 may include a display 444, one or more input devices 446 (e.g., a keyboard, a mouse), and a processor 448. The networked workstation 442 may be located within the same facility as the operator workstation 402, or in a different facility, such as a different healthcare institution or clinic.

The networked workstation 442 may gain remote access to the data processing server 414 or data store server 416 via the communication system 440. Accordingly, multiple networked workstations 442 may have access to the data processing server 414 and the data store server 416. In this manner, magnetic resonance data, reconstructed images, or other data may be exchanged between the data processing server 414 or the data store server 416 and the networked workstations 442, such that the data or images may be remotely processed by a networked workstation 442.

Figure 5:
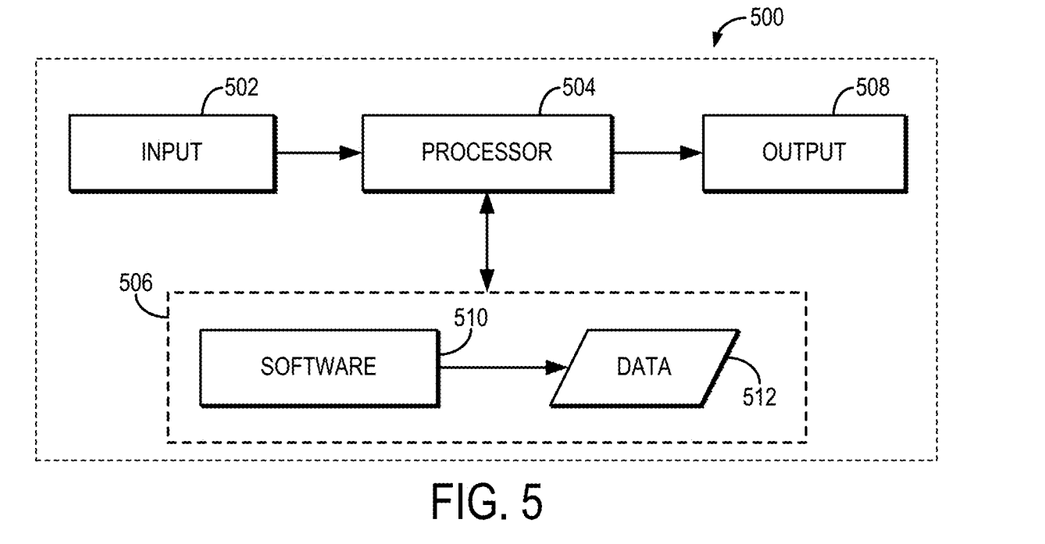
FIG. 5 is a block diagram of an example computer system that can implement the methods described in the present disclosure.

Referring now to FIG. 5, a block diagram of an example of a computer system 500 that can perform the methods described in the present disclosure is shown. The computer system 500 generally includes an input 502, at least one hardware processor 504, a memory 506, and an output 508. Thus, the computer system 500 is generally implemented with a hardware processor 504 and a memory 506.

In some embodiments, the computer system 500 can be a workstation, a notebook computer, a tablet device, a mobile device, a multimedia device, a network server, a mainframe, one or more controllers, one or more microcontrollers, or any other general-purpose or application-specific computing device.

The computer system 500 may operate autonomously or semi-autonomously, or may read executable software instructions from the memory 506 or a computer-readable medium (e.g., a hard drive, a CD-ROM, flash memory), or may receive instructions via the input 502 from a user, or any another source logically connected to a computer or device, such as another networked computer or server. Thus, in some embodiments, the computer system 500 can also include any suitable device for reading computer-readable storage media.

In general, the computer system 500 is programmed or otherwise configured to implement the methods and algorithms described in the present disclosure. For instance, the computer system 500 can be programmed to reduce noise images acquired with an MRI system using the methods described in the present disclosure.

The input 502 may take any suitable shape or form, as desired, for operation of the computer system 500, including the ability for selecting, entering, or otherwise specifying parameters consistent with performing tasks, processing data, or operating the computer system 500. In some aspects, the input 502 may be configured to receive data, such as data acquired with an MRI system or images that have been previously acquired with an MRI system. Such data may be processed as described above to reduce noise in the images, or to otherwise generate images with reduced noise. In addition, the input 502 may also be configured to receive any other data or information considered useful for reducing or otherwise controlling noise using the methods described above.

Among the processing tasks for operating the computer system 500, the one or more hardware processors 504 may also be configured to carry out any number of post-processing steps on data received by way of the input 502.

The memory 506 may contain software 510 and data 512, such as data acquired with an MRI system or images previously acquired with an MRI system, and may be configured for storage and retrieval of processed information, instructions, and data to be processed by the one or more hardware processors 504. In some aspects, the software 510 may contain instructions directed to reducing noise in images or otherwise generating images with reduced noise.

In addition, the output 508 may take any shape or form, as desired, and may be configured for displaying images, such as images in which noise has been reduced using the methods described in the present disclosure, in addition to other desired information.

In some embodiments, any suitable computer readable media can be used for storing instructions for performing the functions and/or processes described herein. For example, in some embodiments, computer readable media can be transitory or non-transitory. For example, non-transitory computer readable media can include media such as magnetic media (e.g., hard disks, floppy disks), optical media (e.g., compact discs, digital video discs, Blu-ray discs), semiconductor media (e.g., random access memory ("RAM"), flash memory, electrically programmable read only memory ("EPROM"), electrically erasable programmable read only memory ("EEPROM")), any suitable media that is not fleeting or devoid of any semblance of permanence during transmission, and/or any suitable tangible media. As another example, transitory computer readable media can include signals on networks, in wires, conductors, optical fibers, circuits, or any suitable media that is fleeting and devoid of any semblance of permanence during transmission, and/or any suitable intangible media.

The present disclosure has described one or more preferred embodiments, and it should be appreciated that many equivalents, alternatives, variations, and modifications, aside from those expressly stated, are possible and within the scope of the invention.

The invention claimed is:

1. A method for generating a denoised image from data acquired with a magnetic resonance imaging (MRI) system, the method including steps comprising:
 (a) controlling an MM system to acquire magnetic resonance (MR) image data from a target;

(b) reconstructing a series of MR images of the target from the MR image data using a computer system, wherein pixel values in each MR image in the series of MR images are defined using signal-to-noise ratio (SNR) units;
(c) selecting with the computer system, an image patch corresponding to the series of MR images;
(d) forming a matrix with the computer system by combining vectors generated using the image patch; and
(e) applying a local low-rank denoising technique with the computer system using the matrix and the series of MR images to generate at least one denoised MR image.

2. The method of claim 1, wherein the MR image data acquired from the target comprises at least one of functional MM (fMRI) image data, diffusion image data, arterial spin labeling (ASL) image data, or parameter imaging data.

3. The method of claim 1, wherein reconstructing the series of MR images in the step (b) comprises utilizing a noise-decorrelation technique.

4. The method of claim 1, wherein reconstructing the series of MR images in the step (b) comprises using a parallel image reconstruction.

5. The method of claim 4, wherein the parallel image reconstruction is a k-space based parallel image reconstruction.

6. The method of claim 5, wherein the k-space based parallel image reconstruction is a Generalized Autocalibrating Partially Parallel Acquisition (GRAPPA) reconstruction.

7. The method of claim 4, wherein the parallel image reconstruction is an image domain-based parallel image reconstruction.

8. The method of claim 7, wherein the image domain-based parallel image reconstruction is a sensitivity-encoding (SENSE) reconstruction.

9. The method of claim 4, further comprising generating a g-factor map based on the parallel image reconstruction and normalizing the series of MR images using the g-factor map.

10. The method of claim 9, further comprising normalizing the at least one denoised MR image using the g-factor map in order to convert the at least one denoised image to the SNR units.

11. The method of claim 4, further comprising generating a g-factor map based on the parallel image reconstruction and normalizing the series of MR images using the g-factor map in order to convert the series of MR images to the SNR units.

12. The method of claim 1, wherein the local low-rank denoising technique implements a singular value decomposition.

13. The method of claim 1, wherein the local low-rank denoising technique implements a singular value thresholding.

14. The method of claim 13, wherein the singular value thresholding is implemented using a threshold value computed based on singular values of a random Gaussian matrix.

15. The method of claim 1, wherein the step (c) comprises extracting blocks of pixels from the series of MR images that are centered on a pixel location.

16. The method of claim 1, wherein the step (c) is repeated to select a plurality of image patches having different patch sizes and the local low-rank denoising technique is a multiscale denoising implemented on the plurality of image patches.

17. The method of claim 1, wherein using the matrix in the step (e) comprises using a distance weighted approach to combine overlapping image blocks.

18. The method of claim 1, wherein the matrix is a Casorati matrix.

19. The method of claim 1, wherein the steps (c) through (e) are repeated using image patches at different scales and a stopping criteria.

\* \* \* \* \*

UNITED STATES PATENT AND TRADEMARK OFFICE
CERTIFICATE OF CORRECTION

PATENT NO.           : 10,768,260 B2
APPLICATION NO.      : 16/133550
DATED                : September 8, 2020
INVENTOR(S)          : Steen Moeller et al.

Page 1 of 1

It is certified that error appears in the above-identified patent and that said Letters Patent is hereby corrected as shown below:

In the Claims

Column 10, Claim 1, Line 66, "MM" should be --MRI--.

Column 11, Claim 2, Line 14, "MM" should be --MRI--.

Signed and Sealed this
Twenty-ninth Day of December, 2020

Andrei Iancu
*Director of the United States Patent and Trademark Office*